United States Patent
Lim et al.

(10) Patent No.: US 9,897,730 B2
(45) Date of Patent: Feb. 20, 2018

(54) DISPLAY DEVICE

(71) Applicant: LG Display Co., Ltd., Seoul (KR)

(72) Inventors: Chae Kyung Lim, Goyang-si (KR); Chang Soo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 195 days.

(21) Appl. No.: 14/844,226

(22) Filed: Sep. 3, 2015

(65) Prior Publication Data

US 2016/0077258 A1 Mar. 17, 2016

(30) Foreign Application Priority Data

Sep. 17, 2014 (KR) ........................ 10-2014-0123398

(51) Int. Cl.
| | |
|---|---|
| *G02B 5/20* | (2006.01) |
| *G02B 5/22* | (2006.01) |
| *C08K 5/3417* | (2006.01) |
| *C08K 5/357* | (2006.01) |
| *C08K 5/3462* | (2006.01) |
| *C08K 5/17* | (2006.01) |
| *G03F 7/00* | (2006.01) |

(52) U.S. Cl.
CPC ............ *G02B 5/223* (2013.01); *C08K 5/17* (2013.01); *C08K 5/3417* (2013.01); *C08K 5/3462* (2013.01); *C08K 5/357* (2013.01); *G02B 5/201* (2013.01); *G03F 7/0007* (2013.01)

(58) Field of Classification Search
CPC ........ G03F 7/0007; G02B 5/201; G02B 5/223
USPC ............................................................ 430/7
See application file for complete search history.

(56) References Cited

U.S. PATENT DOCUMENTS

| | | | | |
|---|---|---|---|---|
| 2008/0112069 A1* | 5/2008 | Helber | ................ | G02B 5/201 359/891 |
| 2016/0139505 A1* | 5/2016 | Taguchi | ................ | C08F 2/44 430/7 |

FOREIGN PATENT DOCUMENTS

| | | |
|---|---|---|
| CN | 102947733 A | 2/2013 |
| JP | 2010-026268 A * | 2/2010 |
| JP | 2012-233960 A * | 11/2012 |

OTHER PUBLICATIONS

Computer-generated translation of JP 2012-232960 (dated Nov. 2012).*
Computer-generated translation of JP 2010-026268 (dated Feb. 2010).*
First Office Action for Chinese Patent Application No. CN 201510587725.X, dated Dec. 5, 2017, 15 Pages. (With English Translation).

* cited by examiner

*Primary Examiner* — John A McPherson
(74) *Attorney, Agent, or Firm* — Fenwick & West LLP

(57) ABSTRACT

Disclosed is a display device comprising a blue color filter including a blue colorant and a purple colorant, whereby a position of a blue color is optimized on color coordinates, and a sharpness of a peak wavelength of the blue color is more enhanced, thereby improving a color gamut.

7 Claims, 5 Drawing Sheets

DISPLAY DEVICE

CROSS REFERENCE TO RELATED APPLICATIONS

This application claims the benefit of Korean Patent Application No. 10-2014-0123398 filed on Sep. 17, 2014, which is hereby incorporated by reference as if fully set forth herein.

BACKGROUND

Field of the Disclosure

Embodiments of the present invention relate to a display device, and more particularly, to a color filter used for a display device.

Discussion of the Related Art

Recently, various display devices have been developed which are capable of replacing an early-stage display device such as a cathode ray tube (CRT). Liquid crystal display (LCD) device, organic light emitting display (OLED) device, and etc. are examples of such devices.

The organic light emitting display device is provided with a light emitting layer disposed between a cathode for injecting electron and an anode for injecting hole. When the electron generated in the cathode and the hole generated in the anode are injected into the inside of the light emitting layer, exciton is produced by the electron and hole bond. Then, when the exciton falls to a ground state from an excited state, the organic light emitting device becomes luminescent, thereby displaying an image.

The organic light emitting display device may have a structure in which a red (R), green (G) or blue (B) light is emitted from a light emitting layer of an individual pixel without an additional color filter, or may have a structure in which a white (W) light is emitted from a light emitting layer, and a color filter of red (R), green (G) or blue (B) color is formed in each individual pixel.

Hereinafter, an organic light emitting display device with a color filter according to the related art will be described with reference to the accompanying drawings.

FIG. 1 is a cross sectional view illustrating the organic light emitting display device according to the related art.

As shown in FIG. 1, the organic light emitting display device according to the related art may include a substrate 10, a thin film transistor 20, a color filter 30, a planarization layer 40, an anode 50, a bank layer 60, a light emitting layer 70, a cathode 80, and an encapsulation layer 90.

The thin film transistor (T) 20 is provided on the substrate 10. The thin film transistor (T) 20 may include a gate electrode 21, a gate insulating film 22, a semiconductor layer 23, a source/drain electrode 24a/24b, and a passivation film 25 sequentially stacked on the substrate 10.

The color filter 30 may be provided on the passivation film 25. The color filter 30 may be formed of a red (R), green (G), or blue (B) color filter.

The planarization layer 40 is provided on the color filter 30, to thereby planarize a surface of the substrate 10.

The anode 50 is provided on the planarization layer 40. The anode 50 is connected with the drain electrode 24b of the thin film transistor (T) 20 via a contact hole provided in the planarization layer 40 and the passivation film 25.

The bank layer 60 is provided on the anode 50, to thereby define a pixel region. The bank layer 60 is formed in the boundary between each pixel, to thereby form a matrix configuration.

The light emitting layer 70 is provided on the anode 50. The light emitting layer 70 is formed of a plurality of organic material layers, and the light emitting layer 70 emits a white (W) light.

The cathode 80 is provided on the light emitting layer 70.

The encapsulation layer 90 is provided on the cathode 80, wherein the encapsulation layer 90 prevents moisture from being permeated into the inside of the light emitting layer 70.

In case of the organic light emitting display device according to the related art, the white (W) light is emitted from the light emitting layer 70 accordingly as an electron generated in the cathode 80 and a hole generated in the anode 50 are injected into the inside of the light emitting layer 70, and only desired-colored light is emitted through the substrate 10 when the emitted white (W) light passes through the color filter 30, thereby displaying an image.

However, when the image is displayed on the organic light emitting display device according to the related art, a color gamut has limits. That is, in case of the organic light emitting display device according to the related art, a desired color is realized when the white (W) light emitted from the light emitting layer 70 passes through the color filter 30. However, a material for the color filter 30, which has been developed up to now, cannot obtain the color gamut which is capable of satisfying various demands of a user.

SUMMARY

Accordingly, embodiments of the present invention are directed to a display device with a color filter that substantially obviates one or more problems due to limitations and disadvantages of the related art.

An aspect of embodiments of the present invention is directed to providing a display device with a color filter which is capable of improving a color gamut.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided a display device that may include red, green, and blue pixels, wherein the blue pixel comprises a blue color filter including a blue colorant represented by a chemical formula 1 and a purple colorant represented by a chemical formula 2, Chemical Formula 1

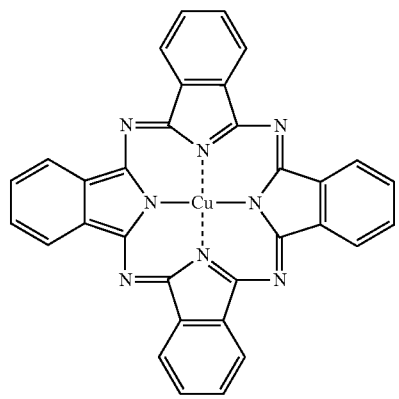

-continued

Chemical Formula 2

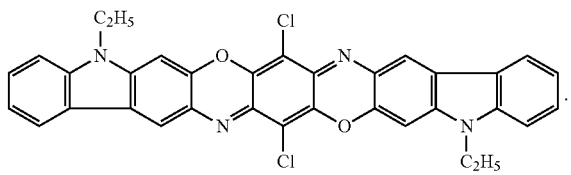

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Figure 1:
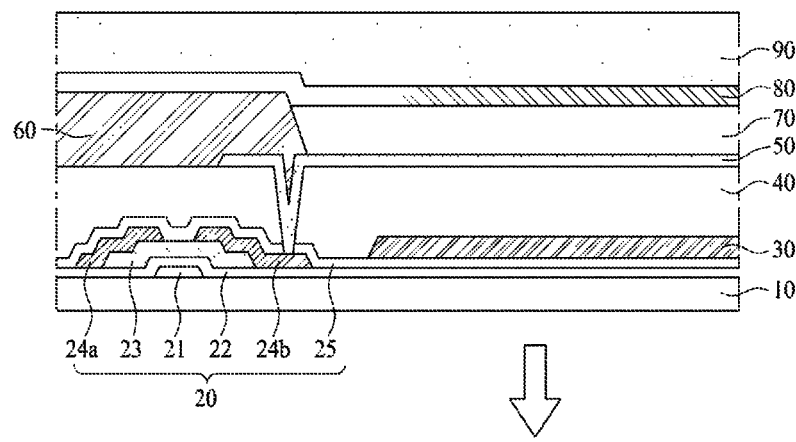
FIG. 1 is a cross sectional view illustrating an organic light emitting display device according to the related art.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting device according to embodiments of the present invention will be described in detail with reference to the accompanying drawings.

Figure 2:
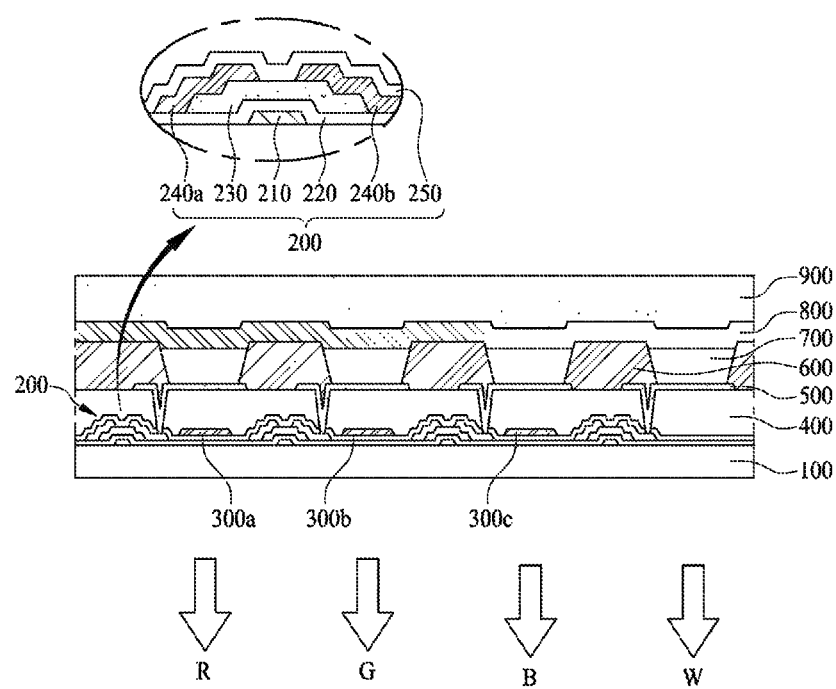
FIG. 2 is a cross sectional view illustrating an organic light emitting display device according to one embodiment of the present invention.

FIG. 2 is a cross sectional view illustrating an organic light emitting display device according to one embodiment of the present invention.

As shown in FIG. 2, the organic light emitting display device according to one embodiment of the present invention may include red (R), green (G), blue (B), and white (W) pixels.

The organic light emitting display device according to one embodiment of the present invention may include a substrate 100, a thin film transistor 200, color filters 300a, 300b, and 300c, a planarization layer 400, a first electrode 500, a bank layer 600, an organic light emitting layer 700, a second electrode 800, and an encapsulation layer 900.

The substrate 100 may be formed of glass or flexible transparent plastic, for example, polyimide, but is not limited to these materials.

The thin film transistor 200 is provided in each of the red (R), green (G), blue (B) and white (W) pixels on the substrate 100. The thin film transistor 200 may include a gate electrode 210, a gate insulating film 220, a semiconductor layer 230, a source electrode 240a, a drain electrode 240b, and a passivation film 250.

The gate electrode 210 is patterned on the substrate 100, the gate insulating film 220 is provided on the gate electrode 210, the semiconductor layer 230 is patterned on the gate insulating film 220, the source electrode 240a and the drain electrode 240b facing each other are patterned on the semiconductor layer 230, and the passivation film 250 is provided on the source electrode 240a and the drain electrode 240b.

The thin film transistor 200 relates to a driving thin film transistor. In the drawings, it shows a driving thin film transistor of a bottom gate structure in which the gate electrode 210 is disposed under the semiconductor layer 230. However, it is possible to provide a driving thin film transistor of a top gate structure in which the gate electrode 210 is disposed above the semiconductor layer 230.

The color filters 300a, 300b, and 300c are provided on the thin film transistor 200, and more particularly, on the passivation film 250. The color filters 300a, 300b, and 300c may include the red color filter 300a provided in the red (R) pixel, the green color filter 300b provided in the green (G) pixel, and the blue color filter 300c provided in the blue (B) pixel.

The blue color filter 300c is formed in combination of a blue colorant for passing a light with a blue wavelength and absorbing a light with other wavelengths, and a purple colorant for passing a light with a purple wavelength and absorbing a light with other wavelengths. In detail, the blue color filter 300c is formed in combination of the blue colorant represented by the following chemical formula 1, and the purple colorant represented by the following chemical formula 2.

Chemical Formula 1

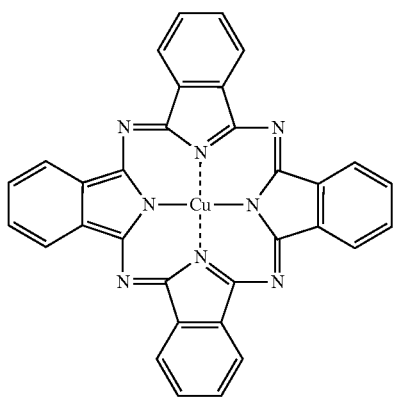

Chemical Formula 2

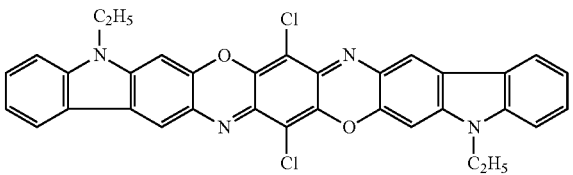

When the blue color filter 300c includes the blue colorant represented by the above chemical formula 1, and the purple colorant represented by the above chemical formula 2, a position of the blue color is optimized on the color coordinates, thereby improving a color gamut of the organic light emitting display device.

Especially, it is preferable that a weight ratio of the blue colorant represented by the above chemical formula 1 to the purple colorant represented by the above chemical formula 2 be within a range of 67~74:26~33. If the weight ratio is within the above range, only the light having the blue wavelength passes through the blue color filter 300c, thereby improving the color gamut. According to one embodiment of the present invention, the blue color filter 300c is formed in combination of the blue colorant and the purple colorant so that the color gamut is improved by an enhanced sharpness of a peak wavelength in the blue color.

Also, a thickness of the blue color filter 300c is within a range of 2.33~2.73 μm, preferably. When the thickness of the blue color filter 300c is within the above range, the y-coordinate value of the color coordinates is optimized so that it is possible to improve the color gamut.

The green color filter 300b is formed in combination of a green colorant for passing a light with a green wavelength and absorbing a light with other wavelengths, and a yellow colorant for passing a light with a yellow wavelength and absorbing a light with other wavelengths. In detail, the green color filter 300b is formed in combination of the green colorant represented by the following chemical formula 3, and the yellow colorant represented by the following chemical formula 4.

Chemical Formula 3

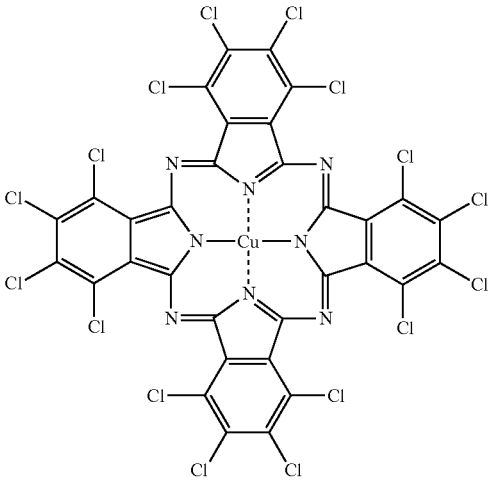

Chemical Formula 4

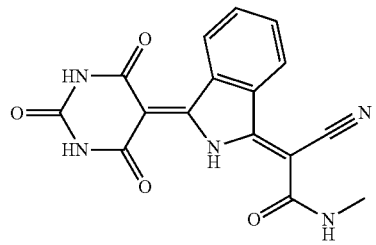

When the green color filter 300b includes the green colorant represented by the above chemical formula 3, and the yellow colorant represented by the above chemical formula 4, a position of the green color is optimized on the color coordinates, thereby improving the color gamut of the organic light emitting display device.

Especially, it is preferable that a weight ratio of the green colorant represented by the above chemical formula 3 to the yellow colorant represented by the above chemical formula 4 be within a range of 54~56:44~46. If the weight ratio is within the above range, only the light having the green wavelength passes through the green color filter 300b, thereby improving the color gamut. According to one embodiment of the present invention, the green color filter 300b is formed in combination of the green colorant and the yellow colorant so that the color gamut is improved by an enhanced sharpness of a peak wavelength in the green color.

Also, a thickness of the green color filter 300b is within a range of 2.41~2.65 μm, preferably. When the thickness of the green color filter 300b is within the above range, the y-coordinate value of the color coordinates is optimized so that it is possible to improve the color gamut.

The red color filter 300a is formed in combination of a red colorant for passing a light with a red wavelength and absorbing a light with other wavelengths, and a yellow colorant for passing a light with a yellow wavelength and absorbing a light with other wavelengths. In detail, the red color filter 300a is formed in combination of the red colorant represented by the following chemical formula 5, and the yellow colorant represented by the following chemical formula 6.

Chemical Formula 5

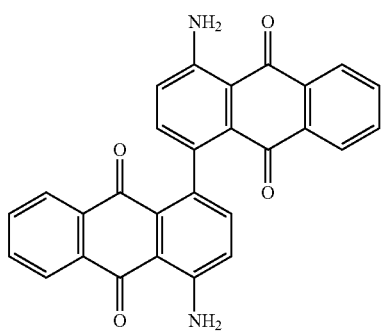

Chemical Formula 6

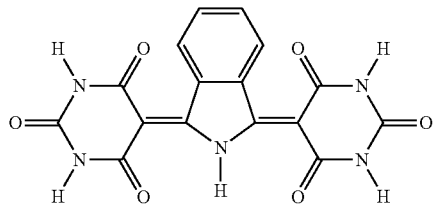

When the red color filter 300a includes the red colorant represented by the above chemical formula 5, and the yellow colorant represented by the above chemical formula 6, a position of the red color is optimized on the color coordinates, thereby improving the color gamut of the organic light emitting display device.

Especially, it is preferable that a weight ratio of the red colorant represented by the above chemical formula 5 to the yellow colorant represented by the above chemical formula 6 be within a range of 73~78:22~27. If the weight ratio is within the above range, only the light having the red wavelength passes through the red color filter 300a, thereby improving the color gamut. According to one embodiment of the present invention, the red color filter 300a is formed in combination of the red colorant and the yellow colorant so that the color gamut is improved by an enhanced sharpness of a peak wavelength in the red color.

Also, a thickness of the red color filter 300a is within a range of 2.09~2.91 μm, preferably. When the thickness of the red color filter 300a is within the above range, the x-coordinate value of the color coordinates is optimized so that it is possible to improve the color gamut.

The planarization layer 400 is provided on the color filters 300a, 300b, and 300c, to thereby planarize a surface of the substrate 100. The planarization layer 400 may be formed of an organic insulating film such as photoacryl, but is not limited to this material.

The first electrode 500 is provided on the planarization layer 400, and is connected with the drain electrode 240b of the thin film transistor. The first electrode 500 functions as an anode. The first electrode 500 is formed of a transparent conductive material such as ITO (Indium Tin Oxide).

The bank layer 600 is provided on the first electrode 500, wherein the bank layer 600 is patterned in a matrix configuration so as to define a pixel region.

The organic light emitting layer 700 is provided on the first electrode 500. Although not shown in detail, the organic light emitting layer 700 may be formed in a sequential stacking structure of a hole injecting layer, a hole transporting layer, an organic emitting material layer, an electron transporting layer, and an electron injecting layer. Herein, except the organic emitting material layer, it is possible to omit one or more layers of the hole injecting layer, the hole transporting layer, the electron transporting layer, and the electron injecting layer.

The organic light emitting layer 700 is provided to emit a white (W) light. The organic light emitting layer 700 for emitting the white (W) light may be formed in combination of red, green, and blue emitting layers, or may be formed in combination of orange and blue emitting layers. In addition, the organic light emitting layer 700 for emitting the white (W) light may be changed to various types generally known to those in the art. While the white (W) light emitted from the organic light emitting layer 700 travels to the aforementioned color filters 300a, 300b, and 300c, only light with a specific wavelength passes through the aforementioned color filters 300a, 300b, and 300c.

The second electrode 800 is provided on the organic light emitting layer 700. The second electrode 800 functions as a cathode. A common voltage may be applied to the second electrode 800. Thus, the second electrode 800 may be provided on the bank layer 600 as well as the organic light emitting layer 700.

The organic light emitting display device of FIG. 2 corresponds to a bottom emission type in which the light emitted from the organic light emitting layer 700 is advanced to the substrate 100 positioned at a lower side of the organic light emitting layer 700. In this case, the first electrode 500 is formed of a transparent conductive material, and the second electrode 800 is formed of an opaque conductive material.

The present invention may include a top emission type in which the light emitted from the organic light emitting layer 700 is advanced to the encapsulation layer 900 positioned at an upper side of the organic light emitting layer 700. In this case, the first electrode 500 is formed of an opaque conductive material, and the second electrode 800 is formed of a transparent conductive material. In case of the top emission type, the color filters 300a, 300b, and 300c are provided on the second electrode 800.

The encapsulation layer 900 is provided on the second electrode 800. The encapsulation layer 900 prevents moisture from being permeated into the inside of the organic light emitting layer 700. The encapsulation layer 900 may be formed of a plurality of layers obtained by stacking a plurality of different inorganic material layers or alternately stacking an inorganic material layer and an organic material layer, or a metal layer attached by the use of adhesive.

Figure 3:
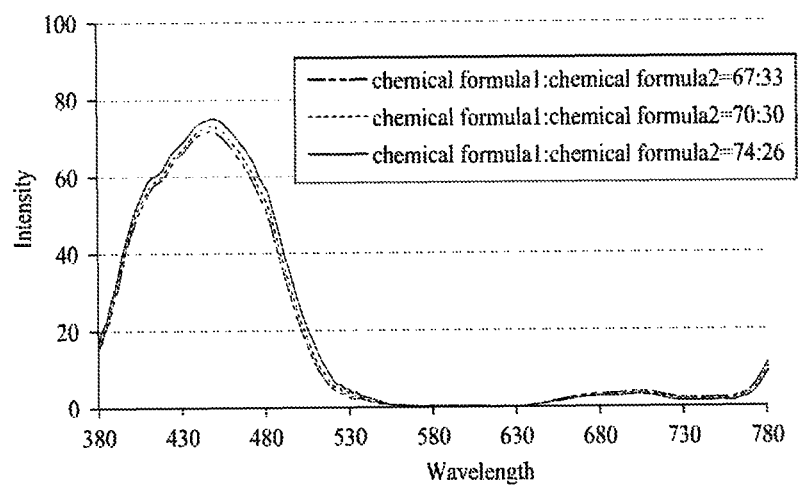
FIG. 3 is a graph showing a change of a peak wavelength in accordance with a weight ratio of a blue colorant represented by a chemical formula 1 to a purple colorant represented by a chemical formula 2 according to one embodiment of the present invention.

FIG. 3 is a graph showing the change of the peak wavelength in accordance with the weight ratio of the blue colorant represented by the above chemical formula 1 to the purple colorant represented by the above chemical formula 2.

As shown in FIG. 3, when the weight ratio of the blue colorant represented by the chemical formula 1 to the purple colorant represented by the chemical formula 2 is 67:33, 70:30, and 74:26, the peak wavelength is obtained at the blue wavelength corresponding to about 450 nm. Accordingly, the weight ratio of the blue colorant represented by the chemical formula 1 to the purple colorant represented by the chemical formula 2 may be set within the range of 67~74: 26~33.

Figure 4:
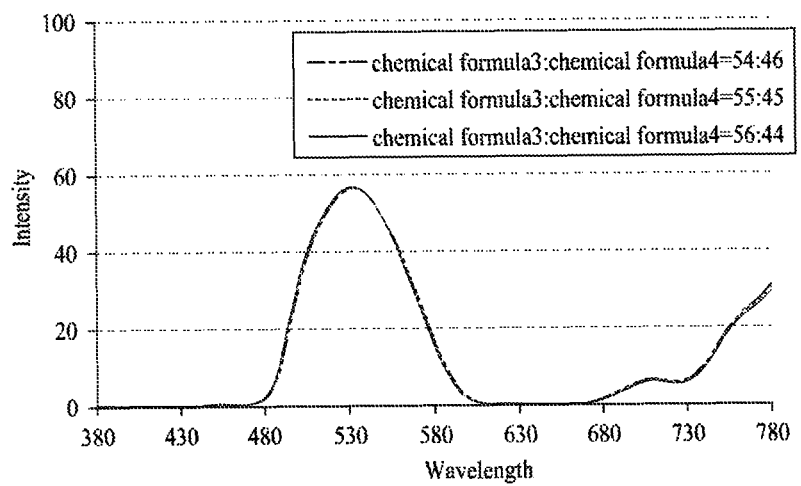
FIG. 4 is a graph showing a change of a peak wavelength in accordance with a weight ratio of a green colorant represented by a chemical formula 3 to a yellow colorant represented by a chemical formula 4 according to one embodiment of the present invention.

FIG. 4 is a graph showing the change of the peak wavelength in accordance with the weight ratio of the green colorant represented by the above chemical formula 3 to the yellow colorant represented by the above chemical formula 4.

As shown in FIG. 4, when the weight ratio of the green colorant represented by the chemical formula 3 to the yellow colorant represented by the chemical formula 4 is 54:46, 55:45, and 56:44, the peak wavelength is obtained at the green wavelength corresponding to about 530 nm. Accordingly, the weight ratio of the green colorant represented by the chemical formula 3 to the yellow colorant represented by the chemical formula 4 may be set within the range of 54~56:44~46.

Figure 5:
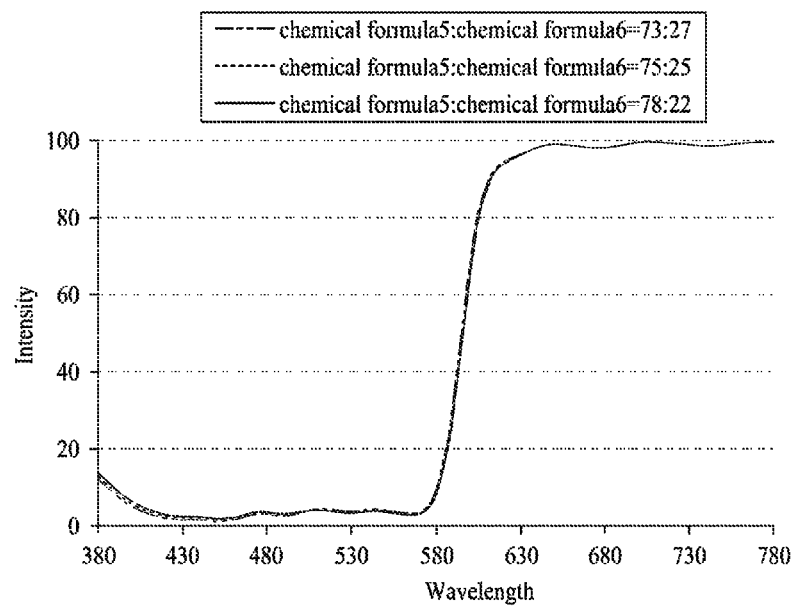
FIG. 5 is a graph showing a change of a peak wavelength in accordance with a weight ratio of a red colorant represented by a chemical formula 5 to a yellow colorant represented by a chemical formula 6 according to one embodiment of the present invention.

FIG. 5 is a graph showing the change of the peak wavelength in accordance with the weight ratio of the red colorant represented by the above chemical formula 5 to the yellow colorant represented by the above chemical formula 6.

As shown in FIG. 5, when the weight ratio of the red colorant represented by the chemical formula 5 to the yellow colorant represented by the chemical formula 6 is 73:27, 75:25, and 78:22, the peak wavelength is obtained at the red wavelength corresponding to about 600 nm. Accordingly, the weight ratio of the red colorant represented by the chemical formula 5 to the yellow colorant represented by the chemical formula 6 may be set within the range of 73~78: 22~27.

Figure 6:
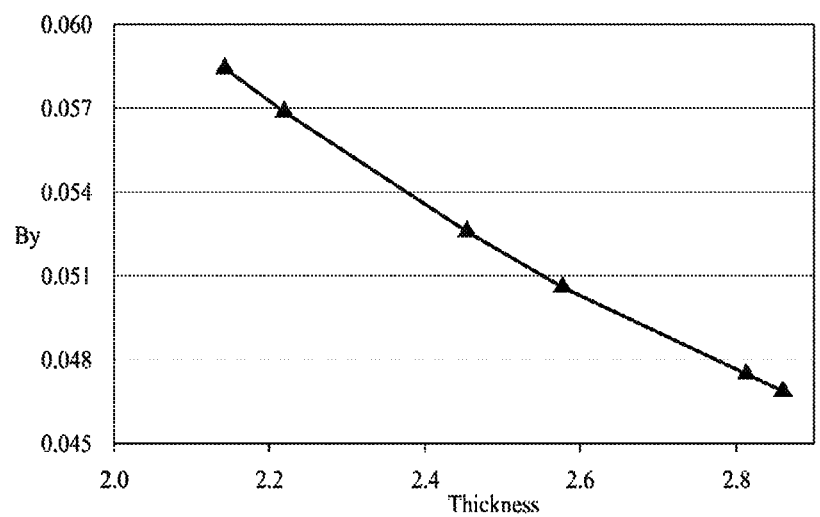
FIG. 6 is a graph showing a change of y-coordinate value (By) on color coordinates in accordance with a change of a thickness in a blue color filter according to one embodiment of the present invention.

FIG. 6 is a graph showing the change of the y-coordinate value (By) on the color coordinates in accordance with the change of the thickness of the blue color filter 300c.

Figure 9:
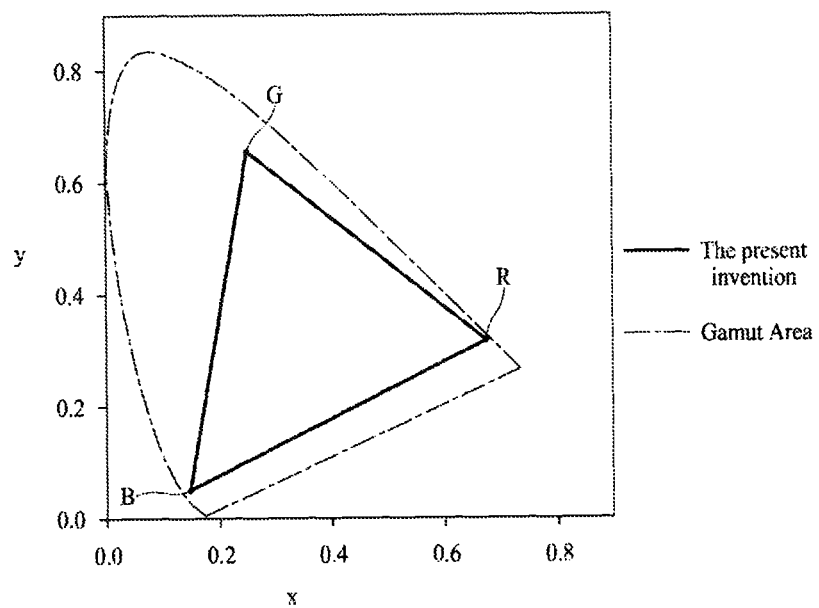
FIG. 9 illustrates color coordinates of an organic light emitting display device including red, green, and blue color filters according to one embodiment of the present invention.

As shown in FIG. 6, as the thickness of the blue color filter 300c is increased, the y-coordinate value (By) of the color coordinates is reduced. In case of the blue (B) color, when the y-coordinate value (By) of the color coordinates is reduced, the color gamut of the blue (B) color is improved. This will be understood with reference to FIG. 9 shown later. Accordingly, as the thickness of the blue color filter 300c is increased, the color gamut is improved. For this reason, the thickness of the blue color filter 300c is no less than 2.33 µm, preferably. If the thickness of the blue color filter 300c is more than 2.73 µm, the x-coordinate value of the blue (B) color may be changed on the color coordinates, and a light transmittance may be lowered. According to one embodiment of the present invention, the thickness of the blue color filter 300c is no more than 2.73 µm, preferably.

Figure 7:
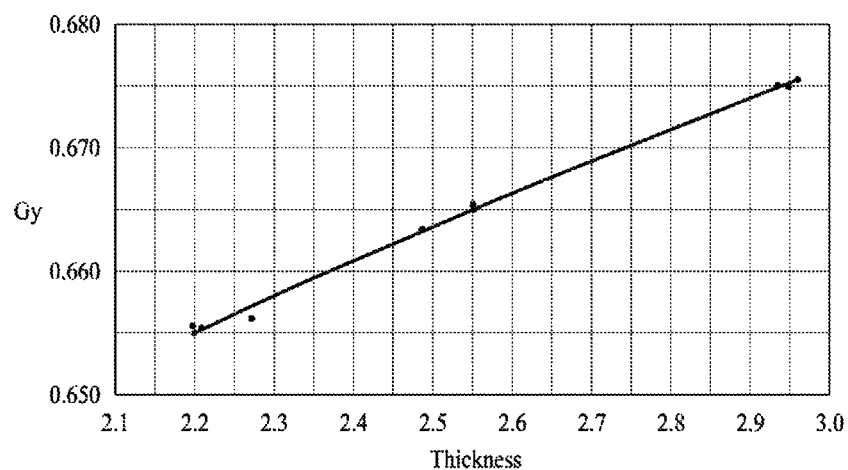
FIG. 7 is a graph showing a change of y-coordinate value (Gy) on color coordinates in accordance with a change of a thickness in a green color filter according to one embodiment of the present invention.

FIG. 7 is a graph showing the change of the y-coordinate value (Gy) on the color coordinates in accordance with the change of the thickness of the green color filter 300b.

As shown in FIG. 7, as the thickness of the green color filter 300b is increased, the y-coordinate value (Gy) of the color coordinates is also increased. In case of the green (G) color, when the y-coordinate value (Gy) of the color coordinates is increased, the color gamut of the green (G) color is improved. This will be understood with reference to FIG. 9 shown later. Accordingly, as the thickness of the green color filter 300b is increased, the color gamut is improved. For this reason, the thickness of the green color filter 300b is no less than 2.41 µm, preferably. If the thickness of the green color filter 300b is more than 2.65 µm, the x-coordinate value of the green (G) color may be changed on the color coordinate, and a light transmittance may be lowered. According to one embodiment of the present invention, the thickness of the green color filter 300b is no more than 2.65 µm, preferably.

Figure 8:
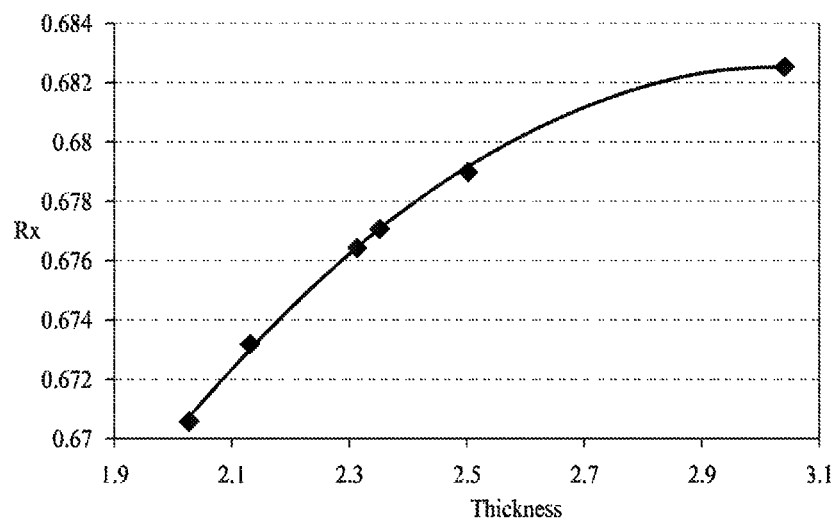
FIG. 8 is a graph showing a change of x-coordinate value (Rx) on color coordinates in accordance with a change of a thickness in a red color filter according to one embodiment of the present invention.

FIG. 8 is a graph showing the change of the x-coordinate value (Rx) on the color coordinates in accordance with the change of the thickness in the red color filter 300a.

As shown in FIG. 8, as the thickness of the red color filter 300a is increased, the x-coordinate value (Rx) of the color coordinates is also increased. In case of the red (R) color, when the x-coordinate value (Rx) of the color coordinates is increased, the color gamut of the red (R) color is improved. This will be understood with reference to FIG. 9 shown later. According as the thickness of the red color filter 300a is increased, the color gamut is improved. In this reason, the thickness of the red color filter 300a is no less than 2.09 µm, preferably. If the thickness of the red color filter 300a is more than 2.91 µm, the x-coordinate value of the red (R) color is not increased on the color coordinate, and a light transmittance is lowered. According to one embodiment of the present invention, the thickness of the red color filter 300a is no more than 2.91 µm, preferably.

FIG. 9 illustrates the color coordinates of the organic light emitting display device including the red color filter 300a, the green color filter 300b, and the blue color filter 300c according to one embodiment of the present invention.

As shown in FIG. 9, the color gamut may be improved when the x-coordinate value of the red (R) color is increased, the color gamut may be improved when the y-coordinate value of the green (G) color is increased, and the color gamut may be improved when the y-coordinate value of the blue (B) color is reduced. According to one embodiment of the present invention, the red (R), green (G), and blue (B) colors are positioned at the coordinates which are advantageous to the color gamut.

The organic light emitting display device according to embodiments of the present invention may be applied to television or mobile devices, to flexible displays, and furthermore to transparent displays generally known to those in the art.

For the above description of the present invention, the organic light emitting display device is explained as the display device according to the present invention, but is not necessarily limited to this. For example, the present invention may be applied to a liquid crystal display device including the aforementioned red color filter 300a, the green color filter 300b, and the blue color filter 300c. The liquid crystal display device may include a first substrate with a thin film transistor, a second substrate with the aforementioned red, green, and blue color filters 300a, 300b, and 300c, and a liquid crystal layer interposed between the first and second substrates. A detailed structure of the liquid crystal display device may be changed to various types generally known to those in the art.

According to the present invention, the blue color filter includes the blue colorant represented by the chemical formula 1 and the purple colorant represented by the chemical formula 2, whereby the position of the blue color is optimized on the color coordinates, and the sharpness of the peak wavelength of the blue color is enhanced, thereby improving the color gamut.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising red, green, and blue pixels, wherein the blue pixel comprises a blue color filter including a blue colorant represented by a chemical formula 1 and a purple colorant represented by a chemical formula 2, Chemical Formula 1

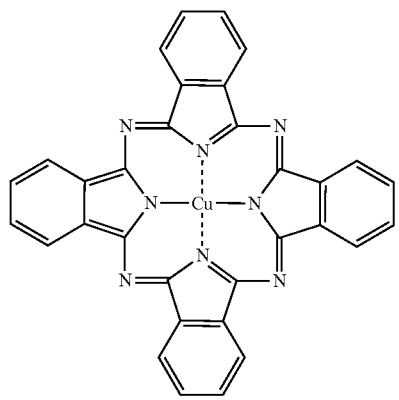

Chemical Formula 2

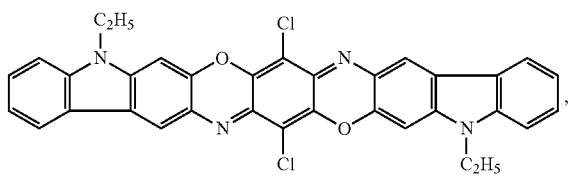

wherein the red pixel comprises a red color filter including a red colorant represented by a chemical formula 3 and a yellow colorant represented by a chemical formula 4, Chemical Formula 3

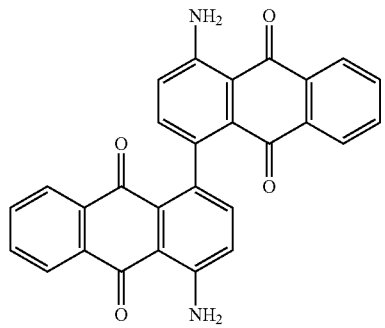

Chemical Formula 4

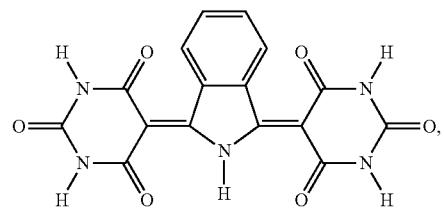

and wherein a thickness of the red color filter is within a range of 2.09~2.91 μm.

2. The display device according to claim 1, wherein a weight ratio of the blue colorant represented by the chemical formula 1 to the purple colorant represented by the chemical formula 2 is 67~74:26~33.

3. The display device according to claim 1, wherein a thickness of the blue color filter is within a range of 2.33~2.73 μm.

4. The display device according to claim 1, wherein the green pixel comprises a green color filter including a green colorant represented by a chemical formula 5 and a yellow colorant represented by a chemical formula 6, Chemical Formula 5

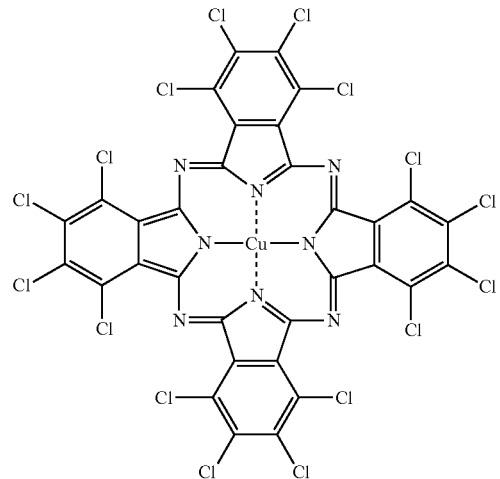

-continued

Chemical Formula 6

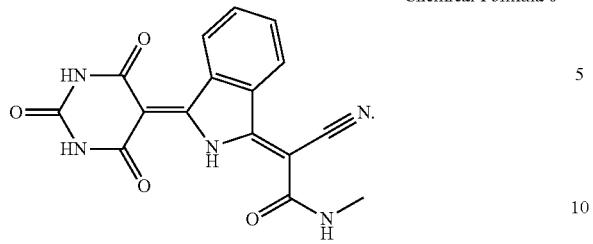

5. The display device according to claim 4, wherein a weight ratio of the green colorant represented by the chemical formula 5 to the yellow colorant represented by the chemical formula 6 is 54~56:44~46.

6. The display device according to claim 4, wherein a thickness of the green color filter is within a range of 2.41~2.65 μm.

7. The display device according to claim 1, wherein a weight ratio of the red colorant represented by the chemical formula 3 to the yellow colorant represented by the chemical formula 4 is 73~78:22~27.

* * * * *